United States Patent
You et al.

(10) Patent No.: US 8,525,174 B2
(45) Date of Patent: Sep. 3, 2013

(54) ORGANIC LIGHT EMITTING DISPLAY DEVICE AND METHOD OF MANUFACTURING THE SAME

(75) Inventors: Chun-Gi You, Yongin (KR); Joon-Hoo Choi, Yongin (KR)

(73) Assignee: Samsung Display Co., Ltd., Giheung-Gu, Yongin, Gyeonggi-Do (HK)

( * ) Notice: Subject to any disclaimer, the term of this patent is extended or adjusted under 35 U.S.C. 154(b) by 75 days.

(21) Appl. No.: 13/082,553

(22) Filed: Apr. 8, 2011

(65) Prior Publication Data
US 2012/0049191 A1 Mar. 1, 2012

(30) Foreign Application Priority Data
Aug. 30, 2010 (KR) .................. 10-2010-0084178

(51) Int. Cl.
- H01L 29/04 (2006.01)
- H01L 31/036 (2006.01)
- H01L 35/24 (2006.01)
- H01L 23/58 (2006.01)
- H01L 23/48 (2006.01)

(52) U.S. Cl.
USPC ............... 257/59; 257/40; 257/642; 257/643; 257/759

(58) Field of Classification Search
USPC .................. 257/59, 98, 43, 71, 40, 642, 643, 257/257/759, 223, 227, 291, 292, 439, 443, 257/655, 72
See application file for complete search history.

(56) References Cited

U.S. PATENT DOCUMENTS

| | | | | |
|---|---|---|---|---|
| 2001/0017684 A1* | 8/2001 | Hirakata et al. | ............... | 349/153 |
| 2007/0132903 A1* | 6/2007 | Lim | ............... | 349/43 |
| 2010/0117176 A1* | 5/2010 | Uekawa | ............... | 257/432 |

FOREIGN PATENT DOCUMENTS

| | | |
|---|---|---|
| KR | 10-2006-0049050 | 5/2006 |
| KR | 10-2007-0068092 | 6/2007 |
| KR | 10-2009-0120698 | 11/2009 |
| KR | 1020090120698 A | 11/2009 |
| KR | 10-0943187 | 2/2010 |

* cited by examiner

*Primary Examiner* — Chuong A. Luu
(74) *Attorney, Agent, or Firm* — Robert E. Bushnell, Esq.

(57) ABSTRACT

An organic light emitting display device constructed with an active layer of a thin film transistor formed on a substrate; a gate electrode including a first transparent conductive layer and a first metal layer formed on the active layer and a first insulating layer, source and drain electrodes including a second metal layer connected to the active layer through a contact hole formed in the second insulating layer, a third metal layer formed on the second metal layer, and a second transparent conductive layer formed on the third metal layer, formed on the gate electrode and a second insulating layer, a pixel electrode including the first transparent conductive layer, the third metal layer, and the second transparent conductive layer formed on the first insulating layer; and an intermediate layer disposed on the pixel electrode.

26 Claims, 13 Drawing Sheets

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Aug. 30, 2010 and there duly assigned Serial No. 10-2010-0084178.

BACKGROUND OF THE INVENTION

1. Field of the Invention

The present invention relates to an organic light emitting display device and a method of manufacturing the same, and more particularly, to an organic light emitting display device having a simple manufacturing process and an excellent display quality, and a method of manufacturing the same.

2. Description of the Related Art

An organic light emitting display device is a self emissive display device in which a voltage is applied to a thin film layer, including an anode, a cathode and an organic emission layer disposed between the anode and the cathode, such that electrons and holes are recombined in the organic emission layer so as to emit light.

Due to a wide viewing angle, a fast response speed, and a low power consumption, as well as small weight and size, organic light emitting display devices are regarded as next-generation display devices.

An organic light emitting display device for realizing full color uses an optical resonance structure for varying an optical length of each wavelength of light emitted from an organic emission layer of each of different pixels, such as red, green and blue pixels.

SUMMARY OF THE INVENTION

The present invention relates to an organic light emitting display device having a simple manufacturing process and an excellent display quality, and a method of manufacturing the same According to an aspect of the present invention, an organic light emitting display device comprises: an active layer of a thin film transistor, which is formed on a substrate; a gate electrode formed on the active layer and a first insulating layer, and including a first transparent conductive layer and a first metal layer; source and drain electrodes formed on the gate electrode and a second insulating layer, and including a second metal layer connected to the active layer through a contact hole formed in the second insulating layer, a third metal layer formed on the second metal layer, and a second transparent conductive layer formed on the third metal layer; a pixel electrode formed on the first insulating layer and including the first transparent conductive layer, the third metal layer, and the second transparent conductive layer; an intermediate layer disposed on the pixel electrode and including an organic emission layer; and a counter electrode disposed so as to face the pixel electrode by intervening the intermediate layer between the pixel electrode and the counter electrode.

The third metal layer may include a reflective material.

The reflective material may include silver (Ag).

Each of the first transparent conductive layer and the second transparent conductive layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Each of the first metal layer and the second metal layer may include multiple metal layers.

The first metal layer and the second metal layer may include the same material.

The first metal layer and the second metal layer may include aluminum (Al).

In the pixel electrode, the first transparent conductive layer may have an etched end different from an etched end of the third metal layer and the second transparent conductive layer.

The first metal layer may be disposed on an upper surface of the first transparent conductive layer, side surfaces of the third metal layer, and a lower surface of a second insulating layer of the pixel electrode.

The first transparent conductive layer of the pixel electrode may be connected to one of the source and drain electrodes through a via hole which penetrates through the first metal layer and the second insulating layer.

The organic light emitting display device may further comprise a capacitor including a first electrode of the same material as, and formed at the same level as, the active layer, and a second electrode including the first transparent conductive layer and formed on the first insulating layer.

The second electrode of the capacitor may further include the third metal layer and the second transparent conductive layer on the first transparent conductive layer.

The pixel electrode may be a transflective mirror for partially transmitting and partially reflecting light emitted from the organic emission layer.

The counter electrode may be a reflective mirror for reflecting light emitted from the organic emission layer.

The organic light emitting display device may further include a pixel defining layer surrounding edges of the pixel electrode and covering the source and drain electrodes.

According to another aspect of the present invention, a method of manufacturing an organic light emitting display device comprises: performing a first mask process for forming a semiconductor layer on a substrate, and for forming an active layer of a thin film transistor by patterning the semiconductor layer; performing a second mask process for forming a first insulating layer, a first transparent conductive layer, and a first metal layer on the active layer, and for forming a base layer of a pixel electrode and a gate electrode of the thin film transistor by patterning the first transparent conductive layer and the first metal layer; performing a third mask process for forming a second insulating layer on the base layer and the gate electrode, and for forming a first opening for exposing the first transparent conductive layer of the base layer, and contact holes for exposing source and drain regions of the thin film transistor, by patterning the second insulating layer; performing a fourth mask process for forming a second metal layer in the first opening and the contact holes, and for forming source and drain electrodes connected to the source and drain regions, by patterning the second metal layer; and performing a fifth mask process for forming a third metal layer and a second transparent conductive layer on the source and drain electrodes, and for forming an upper layer of the pixel electrode and capping layers of the source and drain electrodes by patterning the third metal layer and the second transparent conductive layer.

The method may further include the step, after performing the second mask process, of doping ion impurities on the source and drain regions by using the gate electrode as a mask.

The third mask process may include the first etching process for forming the first opening and the contact holes in the second insulating layer, and the second etching process for removing the first metal layer of the pixel electrode base layer exposed by the first opening.

In the third mask process, a via hole which penetrates through the second insulating layer and the first metal layer of the base layer may be further formed.

In the fourth mask process, the source and drain electrodes may be simultaneously formed in the contact holes and the via hole.

The method may further include the step, after performing the fifth mask process, of forming a fourth insulating layer for exposing the upper layer of the pixel electrode and covering the capping layers of the source and drain electrodes.

The fourth insulating layer may be formed without using a mask process.

The method may further comprise: forming an intermediate layer including an organic emission layer on the upper layer of the pixel electrode; and forming a counter electrode on the intermediate layer.

The third metal layer may include a reflective material, and the upper layer of the pixel electrode may be a transflective mirror for partially transmitting and partially reflecting light.

In the first mask process, a first electrode of a capacitor may be formed by using the same material as, and at the same level as, the active layer, and, in the second mask process, a second electrode of the capacitor may be formed by patterning the first transparent conductive layer.

The method may further comprise the step, after performing the third mask process, of doping ion impurities on the first electrode of the capacitor.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described in detail by explaining embodiments of the invention with reference to the attached drawings.

Figure 17:
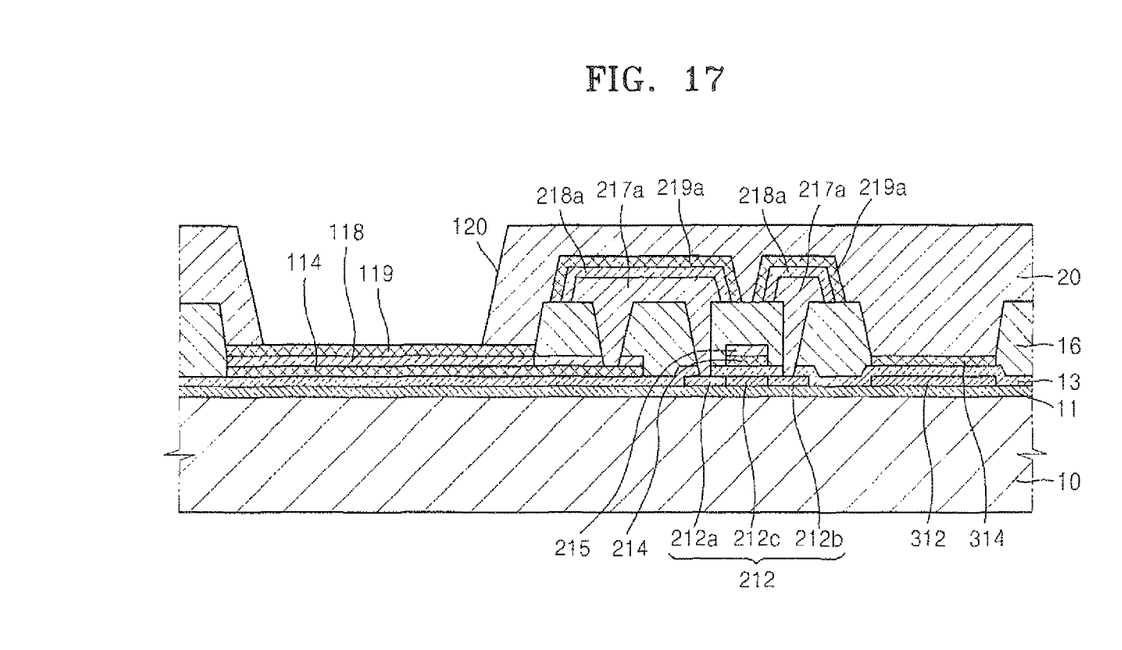
Figure 18:
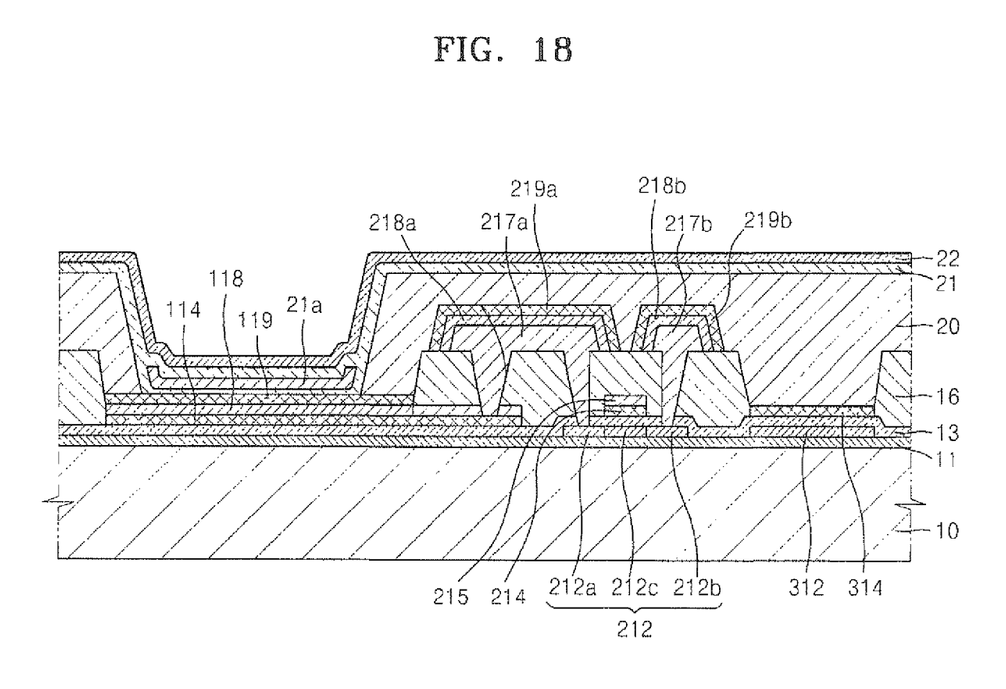
FIG. 18 is a cross-sectional view of the organic light emitting display device manufactured by using the method illustrated in FIGS. 1 thru 17.

FIGS. 1 thru 17 are cross-sectional views for describing a method of manufacturing an organic light emitting display device according to an embodiment of the present invention, and FIG. 18 is a cross-sectional view of the organic light emitting display device manufactured by using the method illustrated in FIGS. 1 thru 17.

Figure 1:
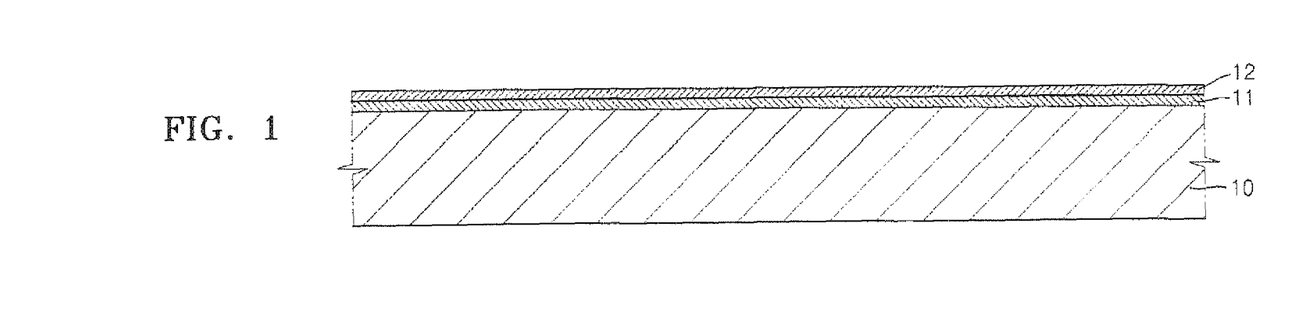
FIGS. 1 thru 17 are cross-sectional views for describing a method of manufacturing an organic light emitting display device according to an embodiment of the present invention.

Referring to FIG. 1, a buffer layer 11 and a semiconductor layer 12 are sequentially formed on a substrate 10.

The substrate 10 may be formed of a transparent glass material mainly including $SiO_2$. The buffer layer 11 including $SiO_2$ and/or $SiN_x$, etc. may be additionally formed on the substrate 10 in order to planarize the substrate 10 and to prevent penetration of impure elements.

The buffer layer 11 and the semiconductor layer 12 may be deposited by using various deposition methods, such as a plasma enhanced chemical vapor deposition (PECVD) method, an atmospheric pressure chemical vapor deposition (APCVD) method, and a low pressure chemical vapor deposition (LPCVD) method.

The semiconductor layer 12 is deposited on the buffer layer 11. The semiconductor layer 12 may be formed of amorphous silicon (Si) or crystalline Si (poly Si). In this case, crystalline Si may be formed by crystallizing amorphous Si by using various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

Figure 2:
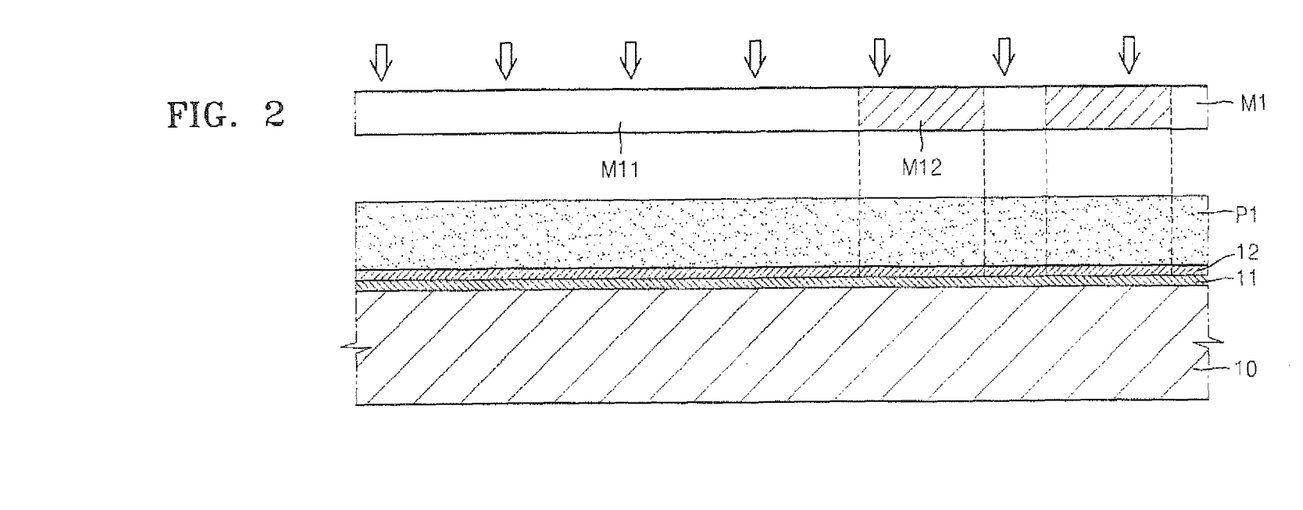

Referring to FIG. 2, a first photoresist P1 is coated on the semiconductor layer 12, and a first mask process is performed by using a first photomask M1, including a light blocking part M11 and a light transmitting part M12.

Although not shown in FIG. 2, an exposure device (not shown) exposes light on the first photomask M1, and then a series of processes such as developing, etching, and stripping or ashing are performed.

Figure 3:
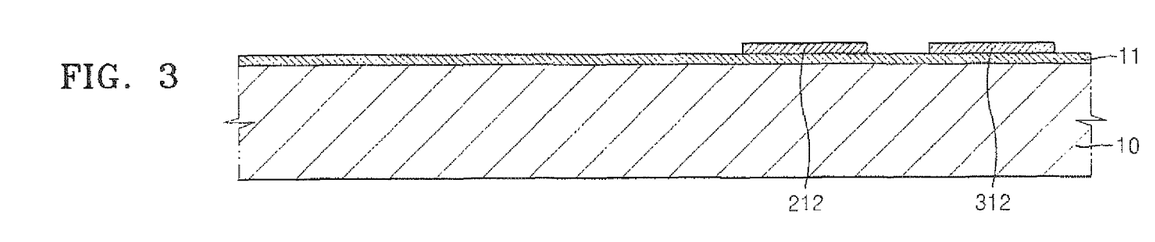

Referring to FIG. 3, as a result of the first photomask process, the semiconductor layer 12 is patterned into an active layer 212 of a thin film transistor, and a first electrode 312 of a capacitor formed at the same level, and by using the same material as the active layer 212.

Figure 4:
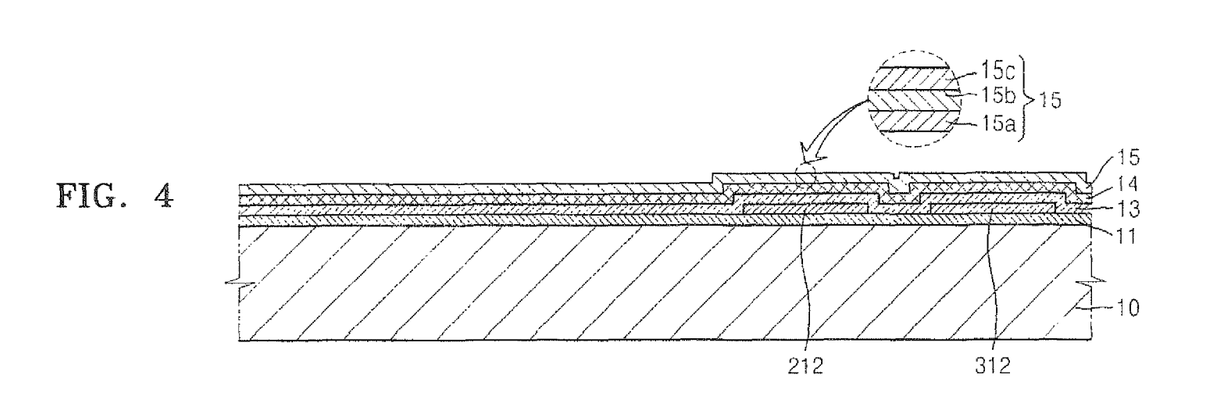

Referring to FIG. 4, a first insulating layer 13, a first transparent conductive layer 14, and a first metal layer 15 are sequentially stacked on the structure illustrated in FIG. 3.

The first insulating layer 13 may include a single layer or a plurality of layers of $SiO_2$, $SiN_x$, etc., and functions as a gate insulating layer of the thin film transistor and a dielectric layer of the capacitor.

The first transparent conductive layer 14 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first metal layer 15 may include at least one metal selected from the group consisting of aluminum (Al), platinum (Pt), palladium (Pd), silver (Ag), magnesium (Mg), gold (Au), Nickel (Ni), neodymium (Nd), iridium (Ir), chromium (Cr), lithium (Li), calcium (Ca), molybdenum (Mo), titanium (Ti), tungsten (W), and copper (Cu). In the current embodiment, the first metal layer 15 includes Al.

Furthermore, the first metal layer 15 may include multiple metal layers 15a, 15b, and 15c. In the current embodiment, a triple layer structure in which Mo layers 15a and 15c are formed on and under, respectively, an Al layer 15b (Mo/Al/Mo) is used. However, the current embodiment is not limited thereto, and the first metal layer 15 may be formed by using various materials in various numbers of layers.

Figure 5:
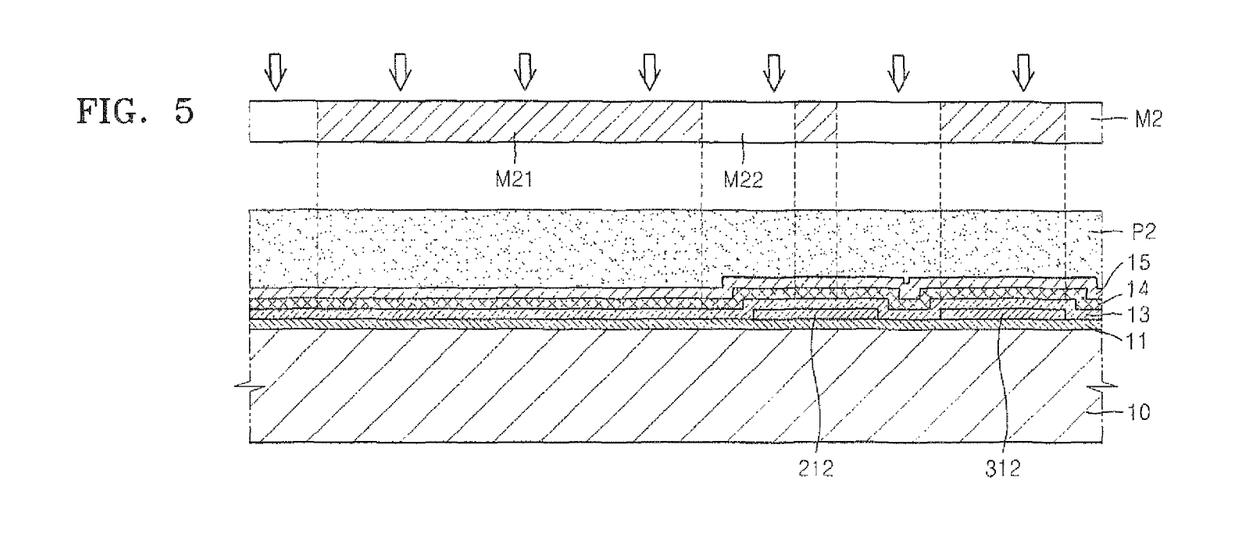

Referring to FIG. 5, a second photoresist P2 is coated on the first metal layer 15 and a second mask process is performed by using a second photomask M2 including a light blocking part M21 and a light transmitting part M22.

Figure 6:
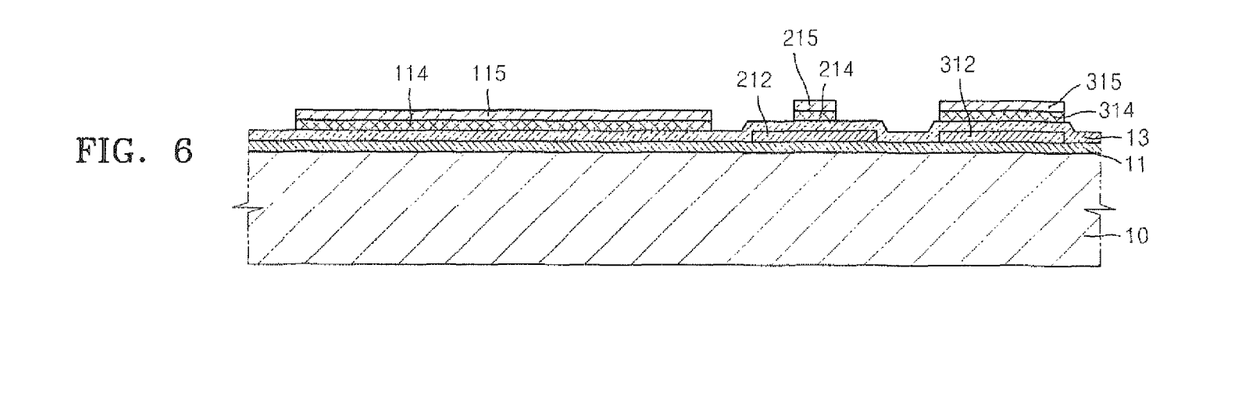

Referring to FIG. 6, as a result of the second mask process, the first transparent conductive layer 14 and the first metal layer 15 are patterned into base layers 114 and 115 of a pixel electrode, gate electrodes 214 and 215 of the thin film transistor, and second electrodes 314 and 315 of the capacitor.

Figure 7:
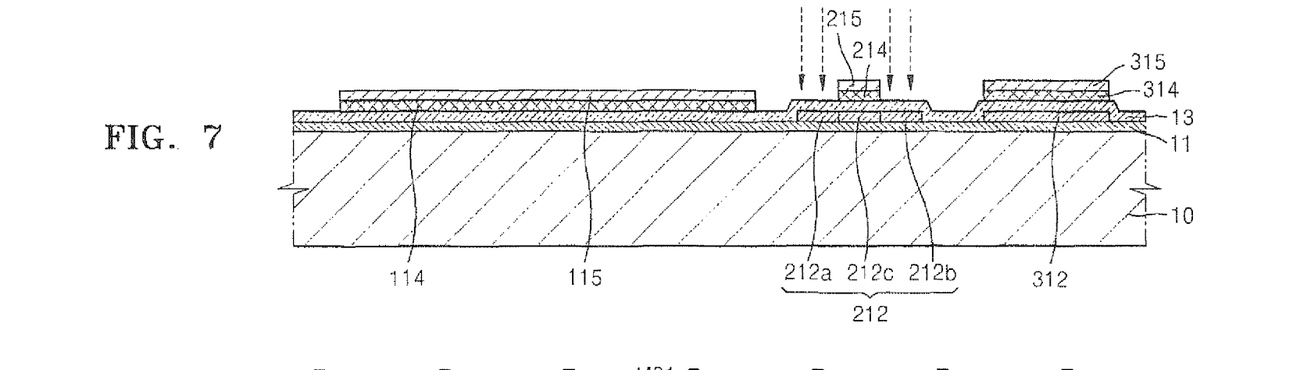

Referring to FIG. 7, ion impurities are doped on the active layer 212 by using, as a self aligning mask, the gate electrodes 214 and 215 formed by performing the second mask process.

As a result, the active layer 212 includes source and drain regions 212a and 212b, respectively, on which the ion impurities are doped, and a channel region 212c between the source and drain regions 212a and 212b, respectively. That is, the source and drain regions 212a and 212b, respectively, may be formed by using the gate electrodes 214 and 215, respectively, as a self aligning mask without forming an additional photo mask.

Figure 8:
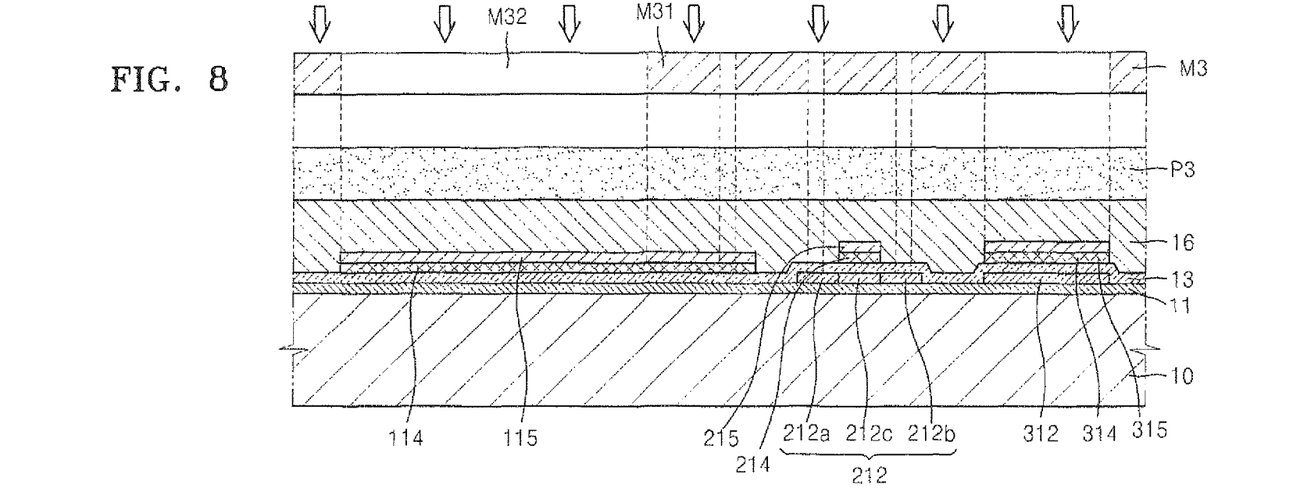

Referring to FIG. 8, a second insulating layer 16 and a third photoresist P3 are coated on the structure obtained by performing the second mask process, and a third mask process is performed by using a third photomask M3 including a light blocking part M31 and a light transmitting part M32.

Figure 9:
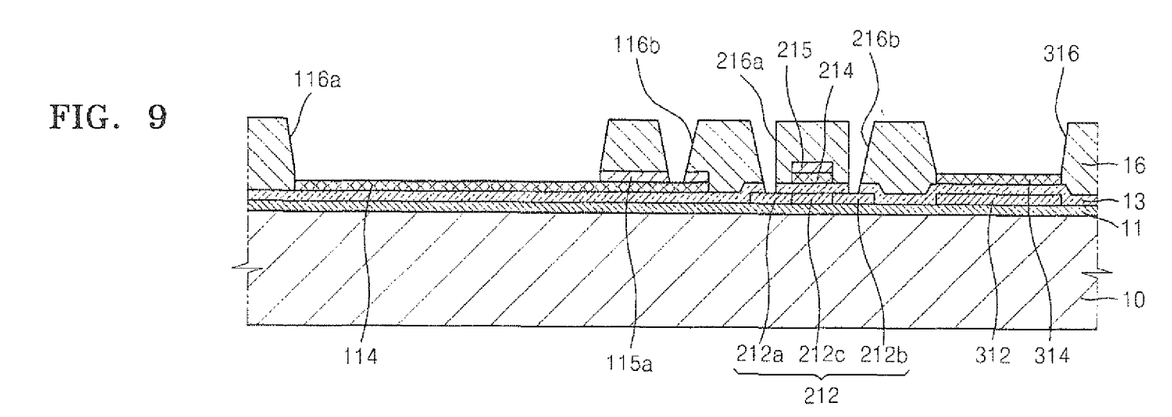

Referring to FIG. 9, as a result of the third mask process, a first opening 116a for exposing the base layers 114 and 115 of the pixel electrode, contact holes 216a and 216b for exposing the source and drain regions 212a and 212b, respectively, of the thin film transistor, and a second opening 316 for exposing the second electrodes 314 and 315 of the capacitor are formed in the second insulating layer 16.

FIG. 9 illustrates a case wherein most of the base layer 115 of the pixel electrode, which is exposed by the first opening 116a, and the second electrode 315 of the capacitor, which is exposed by the second opening 316, are etched and removed after an etching process is performed on the second insulating layer 16.

Meanwhile, a portion 115a of the base layer 115 remains between the first opening 116a and the contact holes 216a and 216b on the base layer 114 of the pixel electrode where the second insulating layer 16 is not removed. A via hole 116b, which penetrates through the second insulating layer 16 and the portion 115a of the base layer 115, may also be formed in the third mask process.

Figure 10:
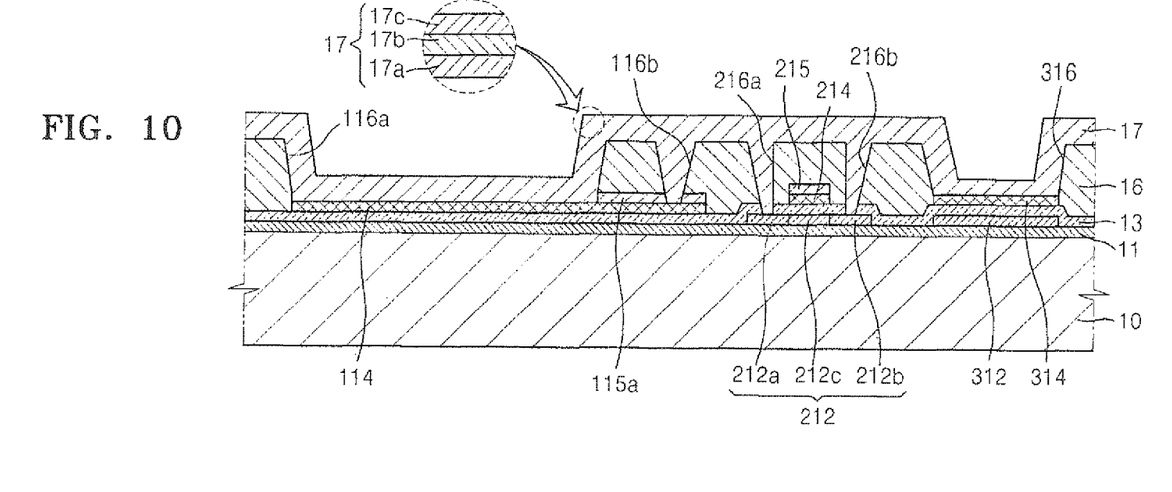

Referring to FIG. 10, a second metal layer 17 is formed on the structure illustrated in FIG. 9.

Like the first metal layer 15, the second metal layer 17 may include at least one metal selected from the group consisting of Al, Pt, Pd, Ag, Mg, Au, Ni, Nd, Ir, Cr, Li, Ca, Mo, Ti, W, and Cu. In the current embodiment, like the first metal layer 15, the second metal layer 17 includes aluminum.

Also, the second metal layer 17 may include multiple metal layers 17a, 17b, and 17c. In the current embodiment, as in the first metal layer 15, a triple layer structure in which Mo layers 17a and 17c are formed on and under an Al layer 17b (Mo/Al/Mo) is used. However, the current embodiment is not limited thereto, and the second metal layer 17 may be formed by using various materials in various numbers of layers.

Figure 11:
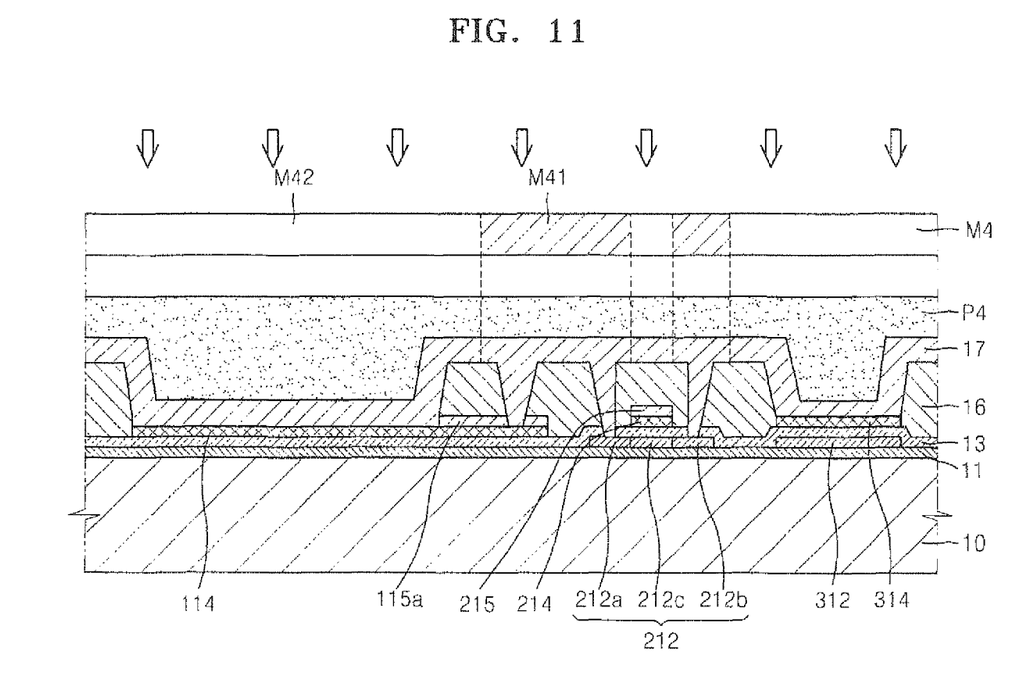

Referring to FIG. 11, a fourth photoresist P4 is coated on the second metal layer 17, and a fourth mask process is performed by using a fourth photomask M4 including a light blocking part M41 and a light transmitting part M42.

Figure 12:
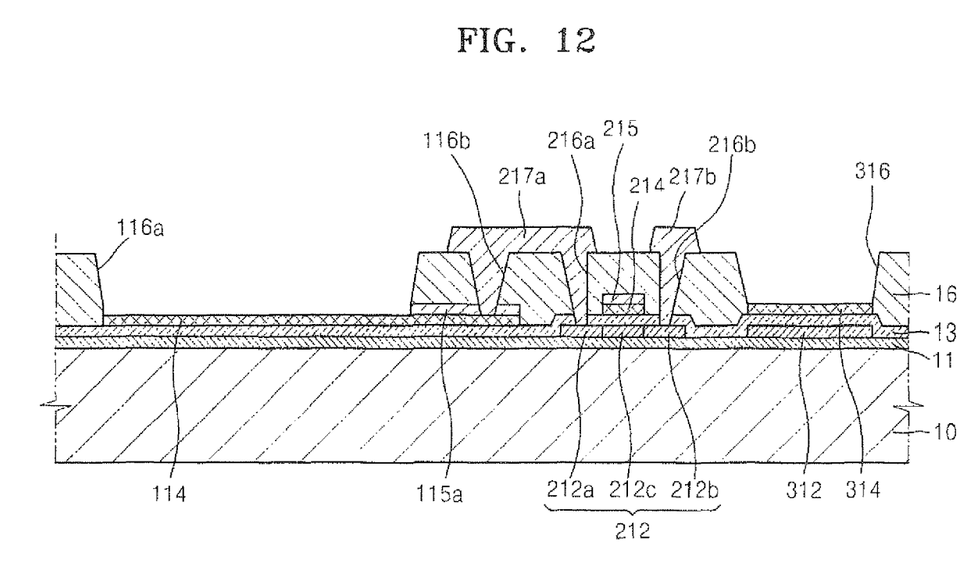

Referring to FIG. 12, portions of the second metal layer 17 in the first opening 116a of the pixel electrode and the second opening 316 of the capacitor are removed, and portions of the second metal layer 17 in the via hole 116b and the contact holes 216a and 216b are electrically connected to the base layer 114 of the pixel electrode and the source and drain regions 212a and 212b, respectively, so as to form source and drain electrodes 217a and 217b, respectively.

Figure 13:
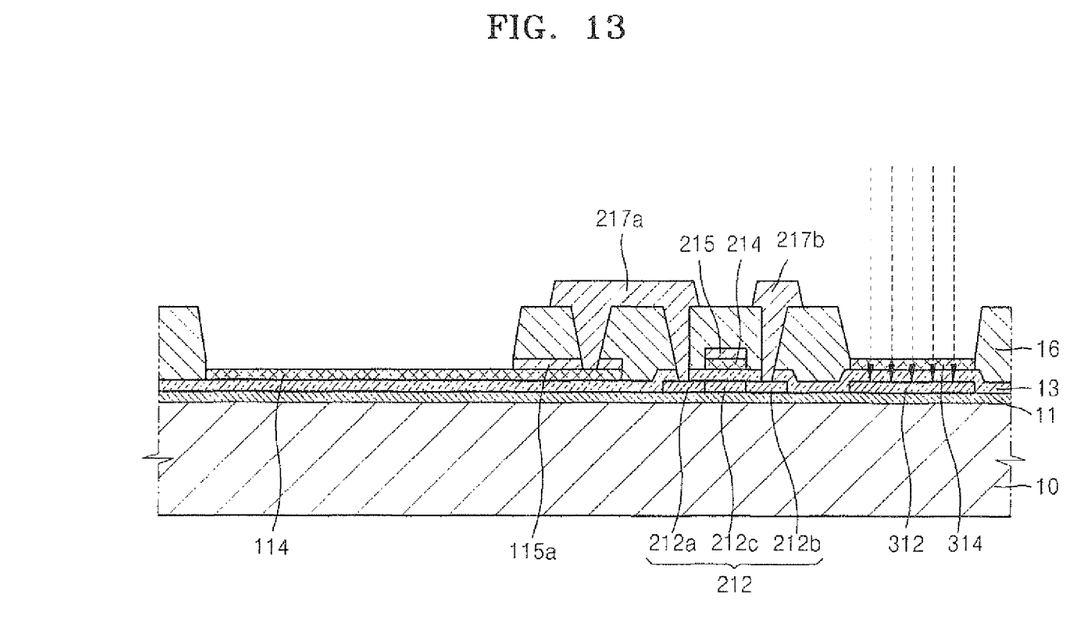

Referring to FIG. 13, ion impurities are doped on the second electrode 314 of the capacitor, from which the gate electrode 215 is removed. Accordingly, the conductivity of the first electrode 312 of the capacitor, which is formed by patterning the semiconductor layer 12, may be increased, and thus the capacitance of the capacitor may be increased.

Figure 14:
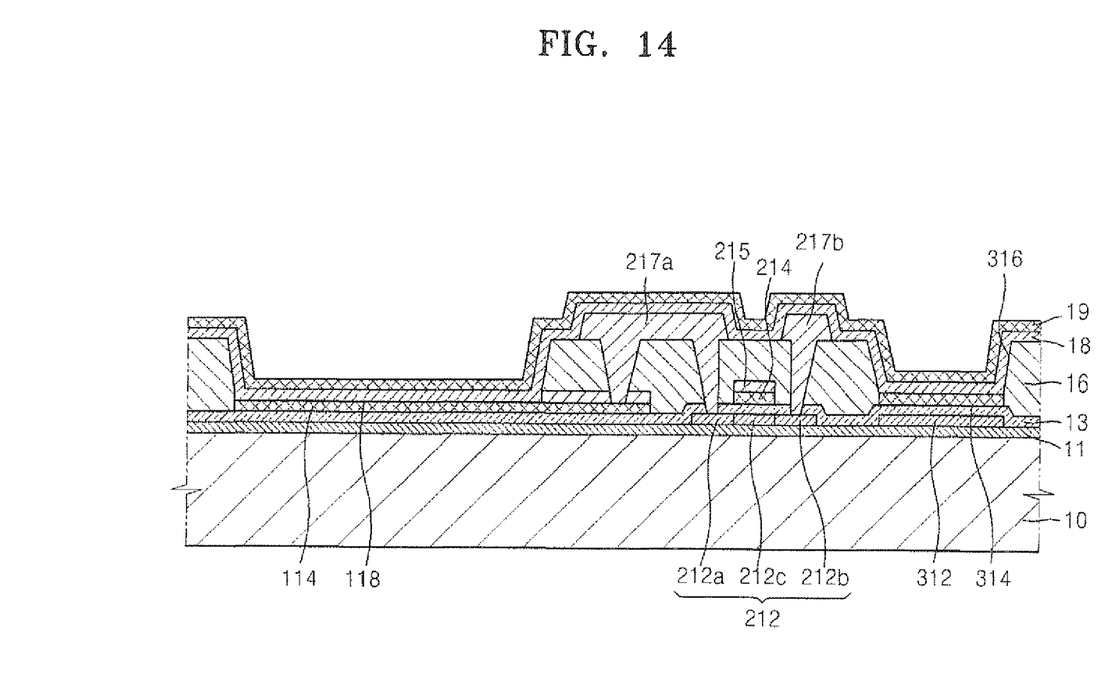

Referring to FIG. 14, a third metal layer 18 and a second transparent conductive layer 19 are sequentially formed on the structure illustrated in FIG. 13.

The third metal layer 18 includes a reflective material. Although Ag is used as the reflective material in the current embodiment, the current embodiment is not limited thereto. That is, the third metal layer 18 may include various reflective materials.

Like the first transparent conductive layer 14, the second transparent conductive layer 19 may include at least one selected from the group consisting of ITO, IZO, ZnO, $In_2O_3$, IGO, and AZO.

Figure 15:
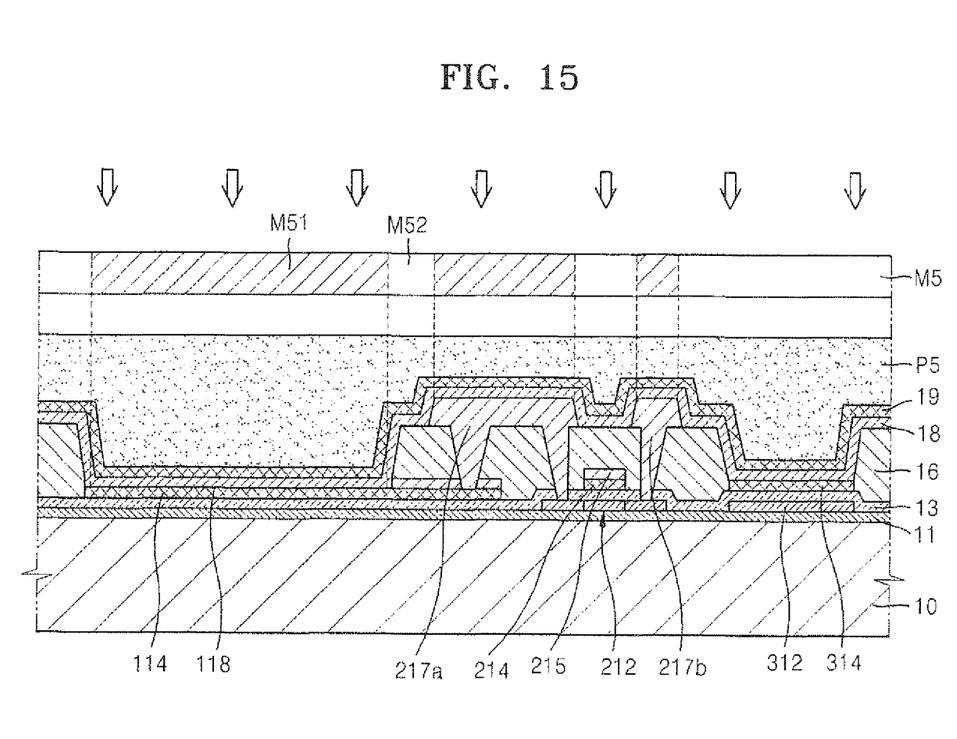

Referring to FIG. 15, a fifth photoresist P5 is coated on the third metal layer 18 and the second transparent conductive layer 19, and a fifth mask process is performed by using a fifth photomask M5 including a light blocking part M51 and a light transmitting part M52.

Figure 16:
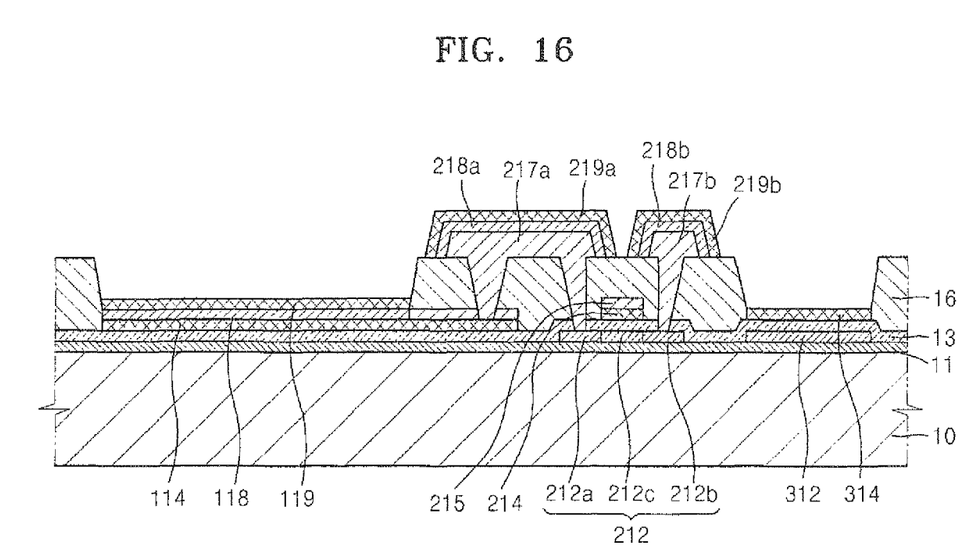

Referring to FIG. 16, as a result of the fifth mask process, the third metal layer 18 and the second transparent conductive layer 19 are patterned into upper layers 118 and 119, respectively, of the pixel electrode, capping layers 218a and 219a, respectively, for covering the source electrode 217a, and capping layers 218b and 219b, respectively, for covering the drain electrode 217b.

Since the upper layers 118 and 119 of the pixel electrode are formed by patterning the third metal layer 18, including the reflective material, and the second transparent conductive layer 19, light may be partially transmitted and partially reflected by controlling the thickness of the upper layer 118. That is, the upper layers 118 and 119 of the pixel electrode, capable of partially transmitting and partially reflecting light, may be used as a transflective mirror of the organic light emitting display device which adopts an optical resonance structure.

In the current embodiment, the upper layers 118 and 119 of the pixel electrode, which function as the transflective mirror, are formed after the second mask process for forming the gate electrodes 214 and 215 and the base layers 114 and 115 of the pixel electrode, the third mask process for partially etching the base layers 114 and 115 of the pixel electrode, and the fourth mask process for forming the source and drain electrodes 217a and 217b, respectively. That is, the upper layers 118 and 119 of the pixel electrode, which function as the transflective mirror, are formed on the base layer 114 of the pixel electrode in the fifth mask process for forming the capping layers 218a, 219a, 218b, and 219b of the source and drain electrodes 217a and 217b, respectively.

If the upper layers 118 and 119 of the pixel electrode, which function as the transflective mirror, are formed in the second mask process for forming the gate electrodes 214 and 215, that is, if the gate electrode 214 is formed so as to further include the third metal layer 18 and the second transparent conductive layer 19, the total thickness of the gate electrode 214 is increased, and thus the gate electrode 214 and wirings (not shown) connected to the gate electrode 214 may not be easily formed.

Also, if the above-described transflective mirror is formed under the first metal layer 15 for forming the pixel electrode, the transflective mirror may be damaged by an etchant for removing the first metal layer 15 in the third mask process for removing the first metal layer 15 formed on the pixel electrode. In particular, if the transflective mirror includes Ag and the first metal layer 15 includes Al as in the current embodiment, the transflective mirror may be seriously damaged by an Al etchant.

Furthermore, in the fourth mask process for forming the source and drain electrodes 217a and 217b, respectively, the transflective mirror may also be damaged by an etchant for removing the second metal layer 17 formed on the transflective mirror. In particular, if the transflective mirror includes Ag and the second metal layer 17 includes Al as in the current embodiment, the transflective mirror may be seriously damaged by an Al etchant.

However, according to the current embodiment, since the transflective mirror is formed after the source and drain electrodes 217a and 217b, respectively, are formed, the transflective mirror may not be damaged by an etchant for removing the second metal layer 17 for forming the source and drain electrodes 217a and 217b, respectively. Accordingly, materials for forming the transflective mirror may be freely selected.

Also, according to the current embodiment, since the capping layers 218a, 219a, 218b, and 219b are formed on the source and drain electrodes 217a and 217b, respectively, the source and drain electrodes 217a and 217b, respectively, and wirings (not shown) connected to the source and drain electrodes 217a and 217b, respectively, may become thinner by the thickness of the capping layers 218a, 219a, 218b, and 219b. Accordingly, the wirings may be easily patterned. Furthermore, since the wirings are protected by the capping layers 218a, 219a, 218b, and 219b, corrosion of the wirings may be reduced, and thus the lifetime of a product may be increased.

In addition, according to the current embodiment, since the pixel electrode may function as a transflective mirror, a counter electrode may be formed as a reflective mirror, and thus an organic light emitting display device may be easily formed in an optical resonance structure. Since the optical resonance structure according to the current embodiment may be formed by performing a mask process a total of five times, the organic light emitting display device may be manufactured by performing a small number of mask processes.

Meanwhile, although the second electrode 314 of the capacitor includes only the first transparent conductive layer 14 in FIG. 16, the current embodiment is not limited thereto. That is, the third metal layer 18 and the second transparent conductive layer 19 may be further formed on the first electrode 314, including the first transparent conductive layer 14.

Referring to FIG. 17, a fourth insulating layer 20 for forming a pixel defining layer is formed on edges of the upper layers 118 and 119 of the pixel electrode and on the source and drain electrodes 217a and 217b, respectively. The pixel defining layer defines a light emitting region and prevents a short between the pixel electrode (the base layer 114 and the upper layers 118 and 119) and a counter electrode 22 (to be described later in relation to FIG. 18) by increasing the distance between the edges of the upper layers 118 and 119 of the pixel electrode and the counter electrode 22, and thus preventing concentration of an electrical field on the edges of the upper layers 118 and 119 of the pixel electrode.

The fourth insulating layer 20 may be an organic or inorganic insulating layer. Also, although the fourth insulating layer 20 may be patterned by using a photo mask, in the current embodiment, the fourth insulating layer 20 is formed by using, for example, an inkjet printing method or a screen printing method in order to reduce the number of mask processes.

Referring to FIG. 18, an intermediate layer 21, including an organic emission layer 21a, and the counter electrode 22 are formed on the upper layers 118 and 119 of the pixel electrode.

The organic emission layer 21a may be formed of a low-molecular or high-molecular organic material.

If the organic emission layer 21a is formed of a low-molecular organic material, the intermediate layer 21 may be formed by stacking a hole transport layer (HTL) and a hole injection layer (HIL) in a direction from the organic emission layer 21a toward the pixel electrode (the base layer 114 and the upper layers 118 and 119), and by stacking an emission layer (EML) and an electron transport layer (ETL) in a direction from the organic emission layer 21a toward the counter electrode 22. In addition, various layers may be stacked, if necessary. In this case, the organic emission layer 21a may be formed of various low-molecular organic materials such as copper phthalocyanine (CuPc), N,N'-Di(naphthalene-1-yl)-N,N'-diphenyl-benzidine (NPB), and tris-8-hydroxyquinoline aluminum (Alq3).

Meanwhile, if the organic emission layer 21a is formed of a high-molecular organic material, the intermediate layer 21 may include only an HTL in the direction from the organic emission layer 21a toward the pixel electrode (the base layer 114 and the upper layers 118 and 119). The HTL may be formed of poly-(2,4)-ethylene-dihydroxy thiophene (PEDOT) or polyaniline (PANI) on the first electrode 312. In this case, the organic emission layer 21a may be formed of various high-molecular organic materials, such as poly-phenylenevinylene (PPV)-based and polyfluorene-based materials, by using a well-known method such as an inkjet printing method, a spin coating method, or a heat transfer method using laser to form a color pattern.

The intermediate layer 21, including the organic emission layer 21a, may realize an optical resonance structure by varying the thickness of the organic emission layer 21a or the thickness of another organic layer (not shown), included in the intermediate layer 21 other than the organic emission layer 21a, in each pixel.

The counter electrode 22 is deposited on the intermediate layer 21 as a common electrode. In the organic light emitting display device according to the current embodiment, the pixel electrode (the base layer 114 and the upper layers 118 and 119) is used as an anode, and the counter electrode 22 may be used as a cathode, or vice versa.

The counter electrode 22 may be a reflective electrode, including a reflective material, so as to realize an optical resonance structure. In this case, the counter electrode 22 may include at least one selected from the group consisting of Al, Mg, Li, Ca, LiF/Ca, and LiF/Al.

Meanwhile, although not shown in FIG. 18, a sealing member (not shown) and an absorbent (not shown) for protecting the organic emission layer 21a from external moisture or oxygen may be further formed on the counter electrode 22.

As described above, the organic light emitting display device and the method of manufacturing the same, according to an embodiment of the present invention, provide the following effects.

First, since a third metal layer and a second transparent conductive layer for forming a transflective mirror are formed after source and drain electrodes are formed, the transflective mirror may be prevented from being damaged by an etchant for etching the source and drain electrodes.

Second, since a third metal layer and a second transparent conductive layer for forming a transflective mirror are formed after source and drain electrodes are formed, materials for forming the transflective mirror may be freely selected.

Third, since capping layers are formed on source and drain electrodes, the thickness of the source and drain electrodes may be reduced, corrosion of wirings may be prevented, and thus the lifetime of a product may be increased.

Fourth, an organic light emitting display device including a transflective mirror may be manufactured by performing a mask process five times.

While the present invention has been particularly shown and described with reference to exemplary embodiments thereof, it will be understood by those of ordinary skill in the art that various changes in form and detail may be made therein without departing from the spirit and scope of the present invention, as defined by the following claims.

What is claimed is:

1. An organic light emitting display device, comprising:
an active layer of a thin film transistor formed on a substrate;
a gate electrode formed on the active layer and a first insulating layer, and comprising a first transparent conductive layer and a first metal layer;
source and drain electrodes formed on the gate electrode and a second insulating layer, and comprising a second metal layer connected to the active layer through a contact hole formed in the second insulating layer, a third metal layer formed on the second metal layer, and a second transparent conductive layer formed on the third metal layer;
a pixel electrode formed on the first insulating layer, and including the first transparent conductive layer, the third metal layer and the second transparent conductive layer;
an intermediate layer disposed on the pixel electrode and comprising an organic emission layer; and
a counter electrode disposed to face the pixel electrode and the intermediate layer, disposed between the pixel electrode and the counter electrode.

2. The organic light emitting display device of claim 1, wherein the third metal layer comprises a reflective material.

3. The organic light emitting display device of claim 2, wherein the reflective material comprises silver (Ag).

4. The organic light emitting display device of claim 1, wherein each of the first transparent conductive layer and the second transparent conductive layer comprises at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

5. The organic light emitting display device of claim 1, wherein each of the first metal layer and the second metal layer comprises multiple metal layers.

6. The organic light emitting display device of claim 1, wherein the first metal layer and the second metal layer comprise the same material.

7. The organic light emitting display device of claim 1, wherein the first metal layer and the second metal layer comprise aluminum (Al).

8. The organic light emitting display device of claim 1, wherein, in the pixel electrode, the first transparent conductive layer has an etched end different from an etched end of the third metal layer and the second transparent conductive layer.

9. The organic light emitting display device of claim 1, wherein the first metal layer is disposed on an upper surface of the first transparent conductive layer, side surfaces of the third metal layer, and a lower surface of the second insulating layer of the pixel electrode.

10. The organic light emitting display device of claim 9, wherein the first transparent conductive layer of the pixel electrode is connected to one of the source and drain electrodes through a via hole which penetrates through the first metal layer and the second insulating layer.

11. The organic light emitting display device of claim 1, further comprising a capacitor including a first electrode of a the same material as, and formed at a same level as, the active layer, and a second electrode including the first transparent conductive layer and formed on the first insulating layer.

12. The organic light emitting display device of claim 11, wherein the second electrode of the capacitor further comprises the third metal layer and the second transparent conductive layer on the first transparent conductive layer.

13. The organic light emitting display device of claim 1, wherein the pixel electrode is a transflective mirror for partially transmitting and partially reflecting light emitted from the organic emission layer.

14. The organic light emitting display device of claim 1, wherein the counter electrode is a reflective mirror for reflecting light emitted from the organic emission layer.

15. The organic light emitting display device of claim 1, further comprising a pixel defining layer surrounding edges of the pixel electrode and covering the source and drain electrodes.

16. An organic light emitting display device, comprising:
a semiconductor layer formed on a substrate and an active layer of a thin film transistor formed by patterning the semiconductor layer;
a first insulating layer, and a first transparent conductive layer;
a first metal layer formed on the active layer, a base layer of a pixel electrode and a gate electrode of the thin film transistor formed by patterning the first transparent conductive layer and the first metal layer;
a second insulating layer formed on the base layer and the gate electrode;
a first opening exposing the first transparent conductive layer of the base layer, and contact holes exposing source and drain regions of the thin film transistor, formed by patterning the second insulating layer;
a second metal layer &limed in the first opening and the contact holes;
source and drain electrodes connected to the source and drain regions, respectively formed by patterning the second metal layer;
a third metal layer and a second transparent conductive layer formed on the source and drain electrodes;
an upper layer of the pixel electrode and capping layers of the source and drain electrodes foamed by patterning the third metal layer and the second transparent conductive layer;
an intermediate layer comprising an organic emission layer formed on the upper layer of the pixel electrode; and
a counter electrode disposed on the intermediate layer to face the pixel layer.

17. The display device of claim 16, further comprising ion impurities doping the source and drain regions by using the gate electrode as a mask.

18. The display device of claim 16, wherein the contact holes formed firstly in the second insulating layer, and the first metal layer of the pixel electrode base layer exposed by the first opening removed secondly.

19. The display device of claim 16, wherein a via hole penetrates through the second insulating layer and the first metal layer of the base layer.

20. The display device of claim 19, comprised of the source and drain electrodes simultaneously formed in the contact holes and the via hole.

21. The display device of claim 16, further comprising the step, after performing the fifth mask process, of forming a fourth insulating layer for exposing the upper layer of the pixel electrode and covering the capping layers of the source and drain electrodes.

22. The display device of claim 21, wherein the fourth insulating layer is formed without using a mask process.

23. The display device of claim 16, further comprising the steps of:
  forming an intermediate layer, comprising an organic emission layer, on the upper layer of the pixel electrode; and
  forming a counter electrode on the intermediate layer.

24. The display device of claim 16, wherein the third metal layer comprises a reflective material, and wherein the upper layer of the pixel electrode is a transflective mirror for partially transmitting and partially reflecting light.

25. The display device claim 16, wherein, a first electrode of a capacitor is formed by using a same material as, and at a same level as, the active layer, and wherein, in the second mask process, a second electrode of the capacitor is formed by patterning the first transparent conductive layer.

26. The display device of claim 25, further comprising the step, after performing the third mask process, of doping ion impurities on the first electrode of the capacitor.

\* \* \* \* \*